(12) United States Patent
Kim et al.

(10) Patent No.: US 11,651,812 B2
(45) Date of Patent: May 16, 2023

(54) SEMICONDUCTOR MEMORY DEVICE FOR PERFORMING TARGET REFRESH OPERATION AND HIDDEN REFRESH OPERATION IN RESPONSE TO NORMAL REFRESH COMMAND AND DETERMINING ROW HAMMER RISK LEVEL

(71) Applicant: SK hynix Inc., Gyeonggi-do (KR)

(72) Inventors: Woongrae Kim, Gyeonggi-do (KR); Duck Hwa Hong, Gyeonggi-do (KR); Jeong Tae Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 98 days.

(21) Appl. No.: 17/365,462

(22) Filed: Jul. 1, 2021

(65) Prior Publication Data

US 2022/0270672 A1 Aug. 25, 2022

(30) Foreign Application Priority Data

Feb. 25, 2021 (KR) .................. 10-2021-0025869

(51) Int. Cl.
*G11C 11/406* (2006.01)
*G11C 11/408* (2006.01)

(52) U.S. Cl.
CPC .... *G11C 11/40618* (2013.01); *G11C 11/4085* (2013.01); *G11C 11/4087* (2013.01); *G11C 11/40615* (2013.01); *G11C 11/40622* (2013.01)

(58) Field of Classification Search
CPC ........ G11C 11/40618; G11C 11/40615; G11C 11/40622; G11C 11/4085; G11C 11/4087

USPC ........................................................ 365/222
See application file for complete search history.

(56) References Cited

U.S. PATENT DOCUMENTS

| 9,384,821 | B2 | 7/2016 | Bains et al. |
| 11,468,936 | B2* | 10/2022 | Lim .................... G11C 11/4076 |
| 2022/0189533 | A1* | 6/2022 | Kim ................... G11C 11/40603 |
| 2022/0189537 | A1* | 6/2022 | Kim ...................... G06F 3/0604 |

FOREIGN PATENT DOCUMENTS

| KR | 10-2014-0012503 | 2/2014 |
| KR | 10-2082441 | 2/2020 |

* cited by examiner

*Primary Examiner* — Connie C Yoha
(74) *Attorney, Agent, or Firm* — IP & T Group LLP

(57) ABSTRACT

A memory system includes: a memory controller suitable for: generating a normal refresh command and a target refresh command when a number of inputs of an active command reaches a certain number, and providing the active command, the normal refresh command, the target refresh command, and an address; and a memory device including a plurality of banks and suitable for: performing a target refresh operation on one or more word lines of at least one bank in response to the target refresh command, determining a row hammer risk level per bank by counting, within a periodic interval, a number of inputs of the target refresh command per bank based on the address, and performing a hidden refresh operation corresponding to the row hammer risk level per bank in response to the normal refresh command.

22 Claims, 11 Drawing Sheets

FIG. 5

| CASE | CNT_BK#<0:3> | GRADE_BK#<0:2> |
|------|--------------|----------------|
| 1    | 0000         | 000            |
| 2    | 0001         | 000            |
| 3    | 0010         | 001            |
| 4    | 0011         | 001            |
| 5    | 0100         | 010            |
| 6    | 0101         | 010            |
| 7    | 0110         | 011            |
| 8    | 0111         | 011            |
| 9    | 1000         | 100            |
| 10   | 1001         | 100            |
| 11   | 1010         | 101            |
| 12   | 1011         | 101            |
| 13   | 1100         | 110            |
| 14   | 1101         | 110            |
| 15   | 1110         | 111            |
| 16   | 1111         | 111            |

FIG. 12

| CASE | CNT_BK#<0:3> | PRE_GRADE_BK#<0:2> | TEMP | GRADE_BK#<0:2> |
|---|---|---|---|---|
| 1 | 0000 | 000 | HIGH | 000 |
| 2 | 0001 | 000 | LOW | 001 |
| 3 | 0010 | 001 | HIGH | 001 |
| 4 | 0011 | 001 | LOW | 010 |
| 5 | 0100 | 010 | HIGH | 010 |
| 6 | 0101 | 010 | LOW | 011 |
| 7 | 0110 | 011 | HIGH | 011 |
| 8 | 0111 | 011 | LOW | 100 |
| 9 | 1000 | 100 | HIGH | 100 |
| 10 | 1001 | 100 | LOW | 101 |
| 11 | 1010 | 101 | HIGH | 101 |
| 12 | 1011 | 101 | LOW | 110 |
| 13 | 1100 | 110 | HIGH | 110 |
| 14 | 1101 | 110 | LOW | 111 |
| 15 | 1110 | 111 | HIGH | 111 |
| 16 | 1111 | 111 | LOW | 111 |

SEMICONDUCTOR MEMORY DEVICE FOR PERFORMING TARGET REFRESH OPERATION AND HIDDEN REFRESH OPERATION IN RESPONSE TO NORMAL REFRESH COMMAND AND DETERMINING ROW HAMMER RISK LEVEL

CROSS-REFERENCE TO RELATED APPLICATIONS

The present application claims priority of Korean Patent Application No. 10-2021-0025869, filed on Feb. 25, 2021, which is incorporated herein by reference in its entirety.

BACKGROUND

1. Field

Various embodiments of the present invention relate to a semiconductor designing technology, and more particularly, to a memory system including a semiconductor memory device that performs a target refresh operation.

2. Description of the Related Art

A memory cell of a semiconductor memory device includes a transistor that functions as a switch and a capacitor that stores charges (or data). A data is determined to be at a logic high level (logic level 1) and at a logic low level (logic level 0) according to whether there is any charge in the capacitor of a memory cell, that is, whether the terminal voltage of the capacitor is high or low.

Data are stored in a form in which charges are accumulated in a capacitor, and theoretically, there is no power consumption. However, since there may be a leakage current due to such reasons as a PN coupling of a transistor, the initial amount of charges stored in the capacitor may disappear, which leads to the loss of data. To prevent this from occurring, the data in a memory cell have be read before the data get lost, and the normal amount of charges according to the read data should be recharged back into the memory cell. The data may be retained only when such an operation is repeated periodically, and the process of recharging cell charges is referred to as a refresh operation which will be, hereinafter, referred to as a normal refresh operation.

Recently, in addition to the normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on a word line that is activated more than a predetermined number of times which is, hereinafter, referred to as a 'target word line', and the word lines disposed adjacent to the word line.

SUMMARY

Embodiments of the present invention are directed to a memory system including a semiconductor memory device capable of determining a level of a row hammer risk per bank by counting the number of inputs of a target refresh command provided from a memory controller at a given interval, and adjusting a target refresh period per bank according to the determined row hammer risk level per bank.

Embodiments of the present invention are directed to a memory system including a semiconductor memory device capable of adjusting a target refresh period per bank according to thermal information as well as the determined row hammer risk level per bank.

Embodiments of the present invention are directed to a memory system including a semiconductor memory device capable of additionally performing a hidden refresh operation for preventing the row hammering phenomenon, during a normal refresh period.

According to an embodiment of the present invention, a memory system includes a memory controller suitable for: generating a normal refresh command and a target refresh command when a number of inputs of an active command reaches a certain number, and providing the active command, the normal refresh command, the target refresh command, and an address; and a memory device including a plurality of banks and suitable for: performing a target refresh operation on one or more word lines of at least one bank in response to the target refresh command, determining a row hammer risk level per bank by counting, within a periodic interval, a number of inputs of the target refresh command per bank based on the address, and performing a hidden refresh operation corresponding to the row hammer risk level per bank in response to the normal refresh command.

According to an embodiment of the present invention, a semiconductor memory device includes a plurality of banks; a refresh control circuit suitable for: determining a row hammer risk level per bank by counting, within a periodic interval, a number of inputs of a target refresh command per bank based on a bank address, generating a plurality of hidden refresh bank signals corresponding to the row hammer risk level per bank in response to a normal refresh command, storing a plurality of sample addresses by sampling an active address in response to an active command, and providing, as a target address, at least one selected from the sample addresses in response to the target refresh command or the hidden refresh bank signals; and a row control circuit suitable for selecting at least one of the banks in response to the target refresh command or the hidden refresh bank signals, and refreshing one or more word lines of the selected bank according to the target address.

According to an embodiment of the present invention, An operating method of a memory device includes repeating a normal refresh operation on a bank, the normal refresh operation being performed in response to plural normal refresh commands; and repeating a hidden refresh operation on the bank according to each target address by: defining a periodic activation section based on a number of times that a target refresh operation is repeated on the bank within a periodic interval; generating, during the periodic activation section, a periodic hidden refresh signal in response to each of the normal refresh commands; and selecting the target address from active addresses in response to the periodic hidden refresh signal.

According to embodiments of the present invention, the memory system may reduce the likelihood of the row hammer occurrence by shortening a target refresh period of a bank with a relatively larger number of inputs of the target refresh command within a set unit time, while reducing the power consumption by lengthening a target refresh period of a bank with relatively fewer inputs of the target refresh command within the set unit time.

Further, according to embodiments of the present invention, the memory system may maximize the target refresh efficiency by additionally performing a hidden refresh operation to prevent the row hammering phenomenon in the normal refresh period, in addition to the target refresh operation during the target refresh period.

BRIEF DESCRIPTION OF THE DRAWINGS

FIG. 5 is a table for describing an operation of a grade analyzing circuit shown in FIG. 3 in accordance with an embodiment of the present invention.

FIG. 12 is a table for describing an operation of a grade analyzing circuit shown in FIG. 11 in accordance with an embodiment of the present invention.

DETAILED DESCRIPTION

Figure 1:
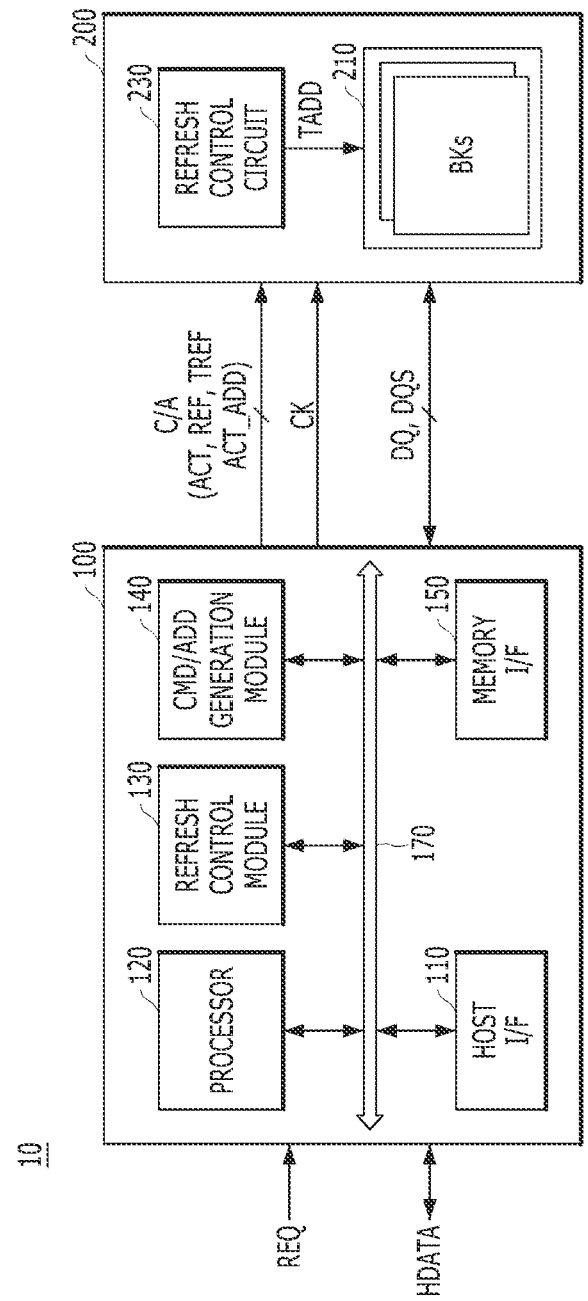
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, to focus on a refresh operation, a description of a configuration associated with a data input/output operation will be omitted. In particular, for ease of description, an address used by a memory controller in a memory system may be assigned by a reference numeral "_ADD", and an address used in a memory device may be assigned by a reference numeral "ADD_".

FIG. 1 is a block diagram illustrating a memory system 10 in accordance with an embodiment of the present invention.

Referring to FIG. 1, the memory system 10 may include a memory controller 100, and a semiconductor memory device 200.

The memory controller 100 may control the general operation of the memory system 10 and it may control general data exchange between a host and the semiconductor memory device 200. The memory controller 100 may generate a command/address signal C/A according to a request REQ from the host, and provide the generated command/address signal C/A to the semiconductor memory device 200. The memory controller 100 may provide a dock CK together with the command/address signal C/A to the semiconductor memory device 200. The memory controller 100 may provide data DQ corresponding to host data HDATA provided from the host to the semiconductor memory device 200 together with a data strobe signal DQS. The memory controller 100 may receive the data DQ read from the semiconductor memory device 200 together with a data strobe signal DQS, and provide the data DQ and the data strobe signal DQS to the host as the host data HDATA.

In detail, the memory controller 100 may include a host interface (host I/F) 110, a processor 120, a refresh control module 130, a command/address (CMD/ADD) generation module 140, a memory interface (memory I/F) 150, and a bus 170.

The host interface 110 may be configured to communicate with the host connected to the memory system 10 under the control of the processor 120. For example, the host interface 110 may receive the request REQ and the host data HDATA from the host, and provide the host data HDATA to the host by receiving the data DQ read from the memory device 200 through the memory interface 150.

The processor 120 may perform various types of computational and/or other operations for controlling the memory device 200, and/or may execute instructions in the form of firmware or other types of software. The processor 120 may receive the request REQ and the host data HDATA provided from the host through the host interface 110. The processor 120 may generate various commands corresponding to the request REQ, such as an active command ACT, a read command, a write command, and an address, to provide the commands to the refresh control module 130 and the command/address generation module 140. The processor 120 may transmit the host data HDATA to the memory interface 150. The address generated with the active command ACT may be defined as an active address ACT_ADD. The processor 120 may control overall operations of the host interface 110, the refresh control module 130, the command address generation module 140, and the memory interface 150.

The refresh control module 130 may generate commands relating to a refresh operation, such as a normal refresh command REF and a target refresh command TREF, based on the active command ACT provided from the processor 120. The refresh control module 130 may generate the target refresh command TREF after generating a set number of the normal refresh commands REF at regular intervals whenever the number of inputs of the active command ACT reaches a certain number, A detailed configuration of the refresh control module 130 will be described in FIG. 2.

The command/address generation module 140 may generate the command/address signal C/A by scheduling the commands and address provided from the processor 120 and the refresh control module 130. The command/address generation module 140 may provide the active address ACT_ADD together with the active command ACT, as the command/address signal C/A, and provide the normal refresh command REF or the target refresh command TREF as the command/address signal C/A. The command/address generation module 140 may provide a bank address including information on banks of the semiconductor memory device 200, together with the normal refresh command REF or the target refresh command TREF, as the command/address signal C/A.

The memory interface 150 may be configured to communicate with the memory device 200 under the control of the processor 120. For example, the memory interface 150 may transmit the command/address signal C/A and the data DQ to the memory device 200, and transmit the data DQ read from the memory device 200 to the host interface 110.

The processor 120 may transmit data between the host interface 110, the refresh control module 130, the command/address generation module 140, and the memory interface 150 via the bus 170. According to an embodiment, the host interface 110, the refresh control module 130, the command/address generation module 140, and the memory interface 150 may communicate with each other independently without passing through the bus 170. For example, the refresh control module 130 and host interface 110 may communicate directly with each other without passing through the bus 170. The refresh control module 130 and the memory interface 150 may communicate with each other directly without passing through the bus 170. The host interface 110 and the memory interface 150 may also communicate directly with each other without passing through the bus 170.

The semiconductor memory device 200 may perform a refresh operation, a write operation, and a read operation according to the dock CK, the command/address signal C/A, the data strobe signal DQS, and/or the data DQ that are provided from the memory controller 100. The refresh operation may include a normal refresh operation in which the semiconductor memory device 200 sequentially refreshes a plurality of word lines during a normal refresh period, and a target refresh operation in which one or more neighboring word lines disposed adjacent to a word line having a large number of activations or a high active frequency are refreshed, during a target refresh period. In particular, according to the embodiment, in addition to the target refresh operation, an additional target refresh operation hereinafter, referred to as a "hidden refresh operation", for preventing the row hammering phenomenon, may be performed during the normal refresh period, not during the target refresh period.

The semiconductor memory device 200 may generate an internal command (ICMD of FIG. 3) and an internal address (IADD of FIG. 3) by buffering the command/address signal C/A, and generate an active command ACT, a precharge command PCG, a normal refresh command REF, and a target refresh command TREF, which are related to a row control operation, by decoding the command ICMD. For reference, the internal address IADD may include an active address when the active command ACT is generated, and the internal address IADD may include a bank address when the target refresh command TREF is generated. The semiconductor memory device 200 may perform the normal refresh operation according to the normal refresh command REF and perform the target refresh operation according to the target refresh command TREF. Further, the semiconductor memory device 200 may additionally generate commands related to data input/output operations (e.g., a read command or a write command) by decoding the internal command ICMD.

In detail, the semiconductor memory device 200 may include a memory cell array 210 and a refresh control circuit 230.

The memory cell array 210 may include a plurality of banks BKs. In each of the banks BKs, a plurality of memory cells (not shown) coupled to a plurality of word lines (not shown) and a plurality of bit lines (not shown) may be arranged in the form of an array.

The refresh control circuit 230 may provide a target address TADD for the target refresh operation by sampling the active address according to the active command ACT at random times. The refresh control circuit 230 may determine the row hammer risk level per bank by counting, within a periodic interval, the number of inputs of the target refresh command TREF per bank based on the bank address included in the internal address IADD. The refresh control circuit 230 may perform the hidden refresh operation according to the determined row hammer risk level per bank when the normal refresh command REF is inputted. That is, by additionally performing the hidden refresh operation for preventing the row hammering phenomenon, during the normal refresh period, the semiconductor memory device 200 may control the target refresh period (frequency or rate) per bank. A detailed configuration of the semiconductor memory device 200 will be described in FIGS. 3 to 9.

As described above, the memory system 10 in accordance with the embodiment of the present invention may determine the row hammer risk level per bank by counting, within the periodic interval, the number of inputs of the target refresh command TREF provided from the memory controller 100 and adjust the target refresh period per bank by performing the hidden refresh operation during the normal refresh period according to the determined row hammer risk level per bank. Accordingly, the memory system 10 may reduce the likelihood of the row hammer occurrence by shortening the target refresh period of a bank with a relatively larger number of inputs of the target refresh command TREF within a set unit time, while reducing the power consumption by lengthening the target refresh period of a bank with a relatively fewer inputs of the target refresh command TREF within the set unit time.

Figure 2:
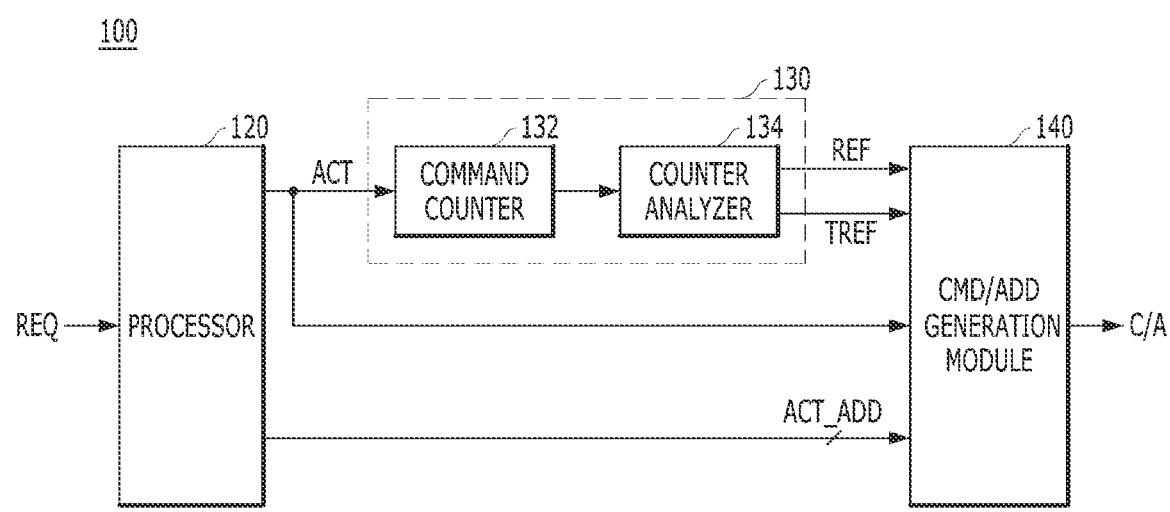
FIG. 2 is a detailed block diagram illustrating a memory controller shown in FIG. 1 in accordance with an embodiment of the present invention.

FIG. 2 is a detailed block diagram illustrating the memory controller 100 shown in FIG. 1. In FIG. 2, to focus on the characteristics of the embodiment, additional configurations (e.g., the host interface 110 and the memory interface 150) have been omitted.

Referring to FIG. 2, the processor 120 may receive the request REQ from the host through the host interface 110. The processor 120 may generate the active command ACT and the active address ACT_ADD corresponding to the request REQ.

The refresh control module 130 may generate the normal refresh command REF and the target refresh command TREF, based on the active command ACT provided from the processor 120. The refresh control module 130 may issue the target refresh command TREF or the normal refresh command REF when the number of inputs of the active command ACT reaches a certain number.

In detail, the refresh control module 130 may include a command counter 132 and a counter analyzer 134.

The command counter 132 may generate a count value by counting the inputs of the active command ACT. The command counter 132 may reset the count value when the inputs of the active command ACT reaches a certain value.

The counter analyzer 134 may issue a set number of the normal refresh commands REF at regular intervals when the count value reaches the certain value. The counter analyzer 134 may issue the target refresh command TREF after issuing the set number of the normal refresh commands REF. For example, the counter analyzer 134 may issue at least one target refresh command TREF after issuing 4096 normal refresh commands REF whenever the count value reaches 10.

The command/address generation module 140 may generate the command/address signal C/A by scheduling the active command ACT and the active address ACT_ADD provided from the processor 120, and the normal refresh commands REF and the target refresh command TREF provided from the refresh control module 130. The command/address generation module 140 may output the active address ACT_ADD together with the active command ACT, as the command/address signal C/A, and provide the normal refresh command REF or the target refresh command TREF together with the bank address including the bank information, as the command/address signal C/A.

Figure 3:
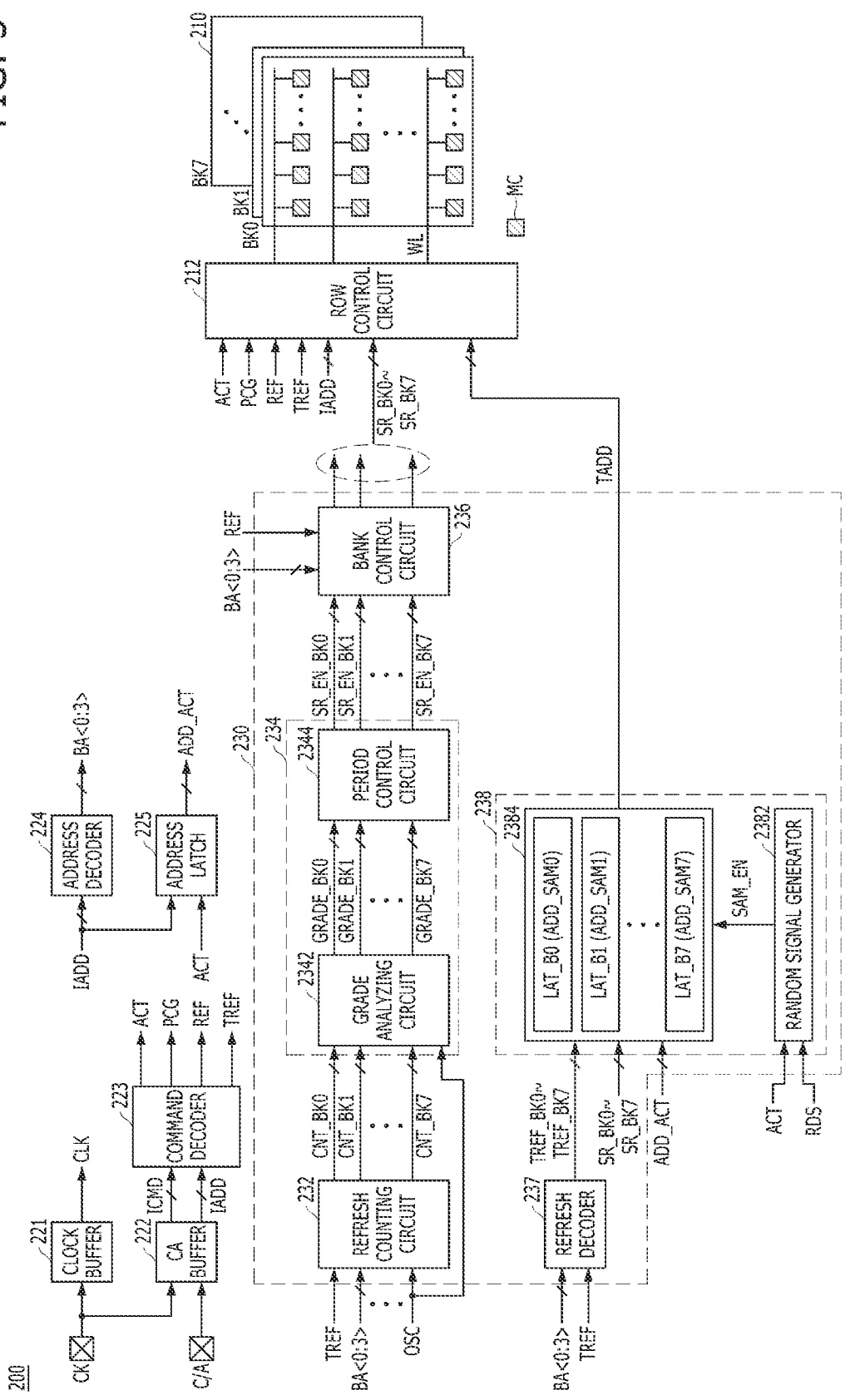
FIG. 3 is a detailed block diagram illustrating a memory device shown in FIG. 1, in accordance with an embodiment of the present invention.

FIG. 3 is a detailed block diagram illustrating the semiconductor memory device 200 shown in FIG. 1, in accordance with an embodiment of the present invention. FIG. 3 shows that the semiconductor memory device 200 includes first to eighth banks BK0 to BK7 in the memory cell array 210.

Referring to FIG. 3, the memory device 200 may include the memory cell array 210, a row control circuit 212, a clock buffer 221, a command/address (CA) buffer 222, a command decoder 223, an address decoder 224, an address latch 225, and the refresh control circuit 230.

The memory cell array 210 may include the first to eighth banks BK0 to BK7. In each of the first to eighth banks BK0 to BK7, memory cells MC coupled to word lines WL and bit lines may be arranged in the form of an array. The number of banks BK0 to BK7 or the number of memory cells MC may be determined depending on the capacity of the semiconductor memory device 200.

The clock buffer 221 may receive the dock CK from the memory controller 100. The dock buffer 221 may generate an internal clock CLK by buffering the dock CK. Depending on an embodiment, the memory controller 100 may transfer system docks CK_t and CK_c to the semiconductor memory device 200 in a differential manner, and the semiconductor memory device 200 may include dock buffers that receive the differential docks CK_t and CK_c, respectively.

The CA buffer 222 may receive the command address signal C/A from the memory controller 100 based on the dock CK. The CA buffer 222 may sample the command/address signal C/A based on the dock CK and output the internal command ICMD and the internal address IADD, Consequently, the semiconductor memory device 200 may be synchronized with the dock CK.

The command decoder 223 may decode the internal command ICMD which is output from the CA buffer 222 to generate an active command ACT, a precharge command PCG, a normal refresh command REF, and a target refresh command TREF. Although not illustrated, the command decoder 223 may additionally generate a read command RD, a write command WT, a mode register command MRS, and the like by decoding the internal command ICMD.

The address decoder 224 may generate a bank address BA<0:3> by decoding the internal address IADD. The bank address BA<0:3> may be used to designate the first to eighth banks BK0 to BK7, Depending on an embodiment, a certain bit of the bank address BA<0:3> may be used to select all of the first to eighth banks BK0 to BK7. Although not illustrated, the address decoder 224 may generate a row address and a column address by decoding the internal address IADD, and provide the addresses to the row control circuit 212 and a column control circuit (not shown).

The address latch 225 may latch the internal address IADD according to the active command ACT to provide an active address ADD_ACT. That is, the address latch 225 may provide the internal address IADD inputted with the active command ACT as the active address ADD_ACT.

The refresh control circuit 230 may determine a row hammer risk level per bank by counting, within a periodic interval, the number of inputs of the target refresh command TREF per bank based on the bank address BA<0:3>. The refresh control circuit 230 may perform a hidden refresh operation according to the determined row hammer risk level per bank when the normal refresh command REF is inputted. The refresh control circuit 230 may control an activation of first to eighth hidden refresh bank signals SR_BK0 to SR_BK7 in response to the normal refresh command REF such that each of the first to eighth banks BK0 to BK7 has a target refresh period (frequency or rate) corresponding to the determined row hammer risk level. Further, the refresh control circuit 230 may store a plurality of sample addresses ADD_SAM0 to ADD_SAMn by sampling the active address ADD_ACT according to the active command ACT at random times, and provide as a target address TADD at least one selected from the sample addresses ADD_SAM0 to ADD_SAMn according to the target refresh command TREF or the first to eighth hidden refresh bank signals SR_BK0 to SR_BK7.

In detail, the refresh control circuit 230 may include a refresh counting circuit 232, a risk analysis circuit 234, a bank control circuit 236, a refresh decoder 237, and an address storing circuit 238.

The refresh counting circuit 232 may be initialized according to an oscillating signal OSC and generate first to eighth bank counting signals CNT_BK0 to CNT_BK7 respectively corresponding to the first to eighth banks BK0 to BK7, by counting the number of inputs of the target refresh command TREF per bank based on the bank address BA<0:3>. The oscillating signal OSC may be enabled at a given period and therefore the refresh counting circuit 232 may count the number of inputs of the target refresh command TREF per bank within a given interval, which is also periodic according to the oscillating signal OSC.

The risk analysis circuit 234 may analyze a row hammer risk for each of the first to eighth banks BK0 to BK7 according to the first to eighth bank counting signals CNT_BK0 to CNT_BK7, and generate first to eighth period control signals SR_EN_BK0 to SR_EN_BK7, each having an activation section determined depending on a result of the analysis. The risk analysis circuit 234 may operate in synchronization with the oscillating signal OSC. For example, as a value of a bank counting signal increases, the risk analysis circuit 234 may analyze a corresponding bank as a bank vulnerable to the row hammer risk, and adjust the activation section of the corresponding period control signal to increase in comparison with a reference section. On the contrary, as a value of a bank counting signal decreases, the risk analysis circuit 234 may analyze a corresponding bank as a bank resistant to the row hammer risk, and adjust the activation section of the corresponding period control signal to decrease in comparison with the reference section.

In detail, the risk analysis circuit 234 may include a grade analyzing circuit 2342 and a period control circuit 2344.

The grade analyzing circuit 2342 may latch the first to eighth bank counting signals CNT_BK0 to CNT_BK7 according to the oscillating signal OSC, and output first to eighth bank grade signals GRADE_BK0 to GRADE_BK7 by dividing the row hammer risk of each of the first to eighth banks BK0 to BK7 into one of a plurality of grades according to the latched bank counting signals CNT_BK0 to CNT_BK7.

The period control circuit 2344 may generate the first to eighth period control signals SR_EN_BK0 to SR_EN_BK7, each having the activation section determined depending on the first to eighth bank grade signals GRADE_BK0 to GRADE_BK7. The first to eighth bank grade signals GRADE_BK0 to GRADE_BK7 may respectively correspond to the first to eighth banks BK0 to BK7, and each of the first to eighth bank grade signals GRADE_BK0 to GRADE_BK7 may be used as a signal for controlling a target refresh period of a corresponding bank.

The bank control circuit 236 may output the first to eighth hidden refresh bank signals SR_BK0 to SR_BK7 according to the bank address BA<0:3> and the first to eighth period control signals SR_EN_BK0 to SR_EN_BK7, when the normal refresh command REF is inputted. The bank control circuit 236 may output the first to eighth hidden refresh bank signals SR_BK0 to SR_BK7 such that the hidden refresh operation is performed during the normal refresh period while controlling the activation of the first to eighth hidden refresh bank signals SR_BK0 to SR_BK7 according to the first to eighth period control signals SR_EN_BK0 to SR_EN_BK7. As a result, the bank control circuit 236 may adjust the target refresh period per bank.

The refresh decoder 237 may generate first to eighth target refresh bank signals TREF_BK0 to TREF_BK7 respectively corresponding to the first to eighth banks BK0 to BK7, by decoding the bank address BA<0:3> according to the target refresh command TREF. For example, the refresh decoder 237 may generate the second target refresh bank signal TREF_BK1 corresponding to the second bank BK1 when the bank address BA<0:3> for designating the second bank BK1 is inputted.

The address storing circuit 238 may generate the sample addresses ADD_SAM0 to ADD_SAMn by latching the active address ADD_ACT at random times, and output as the target address TADD at least one selected from the sample addresses ADD_SAM0 to ADD_SAMn according to the first to eighth target refresh bank signals TREF_BK0 to TREF_BK7 or the first to eighth hidden refresh bank signals SR_BK0 to SR_BK7.

In detail, the address storing circuit 238 may include a random signal generator 2382 and a latch circuit 2384.

The random signal generator 2382 may generate a sampling signal SAM_EN according to a randomly enabled random signal RDS and the active command ACT. The random signal generator 2382 may include a pseudo-random binary sequence (PRBS) based random pattern generator, or a linear feedback shift register (LFSR) based random pattern generator. The random signal generator 2382 may enable the sampling signal SAM_EN when the active command ACT is inputted and the random signal RDS is enabled.

The latch circuit 2384 may include first to eighth latches LAT_B0 to LAT_B7 respectively corresponding to the first to eighth banks BK0 to BK7. Each of the first to eighth latches LAT_B0 to LAT_B7 may store the active address ADD_ACT as a corresponding one of the sample addresses ADD_SAM0 to ADD_SAM7 when the sampling signal SAM_EN is enabled. Each of the first to eighth latches LAT_B0 to LAT_B7 may output a corresponding sample address as the target address TADD when any of a corresponding target refresh bank signal and a corresponding hidden refresh bank signal is enabled. For example, the first latch LAT_B0 may output the sample address ADD_SAM0 stored therein as the target address TADD when any of the first target refresh bank signal TREF_BK0 and the first hidden refresh bank signal SR_BK0 is enabled. Depending on an embodiment, each of the first to eighth latches LAT_B0 to LAT_B7 may be implemented to store a plurality of sample addresses.

The row control circuit 212 may activate the word line WL corresponding to the internal address IADD when the active command ACT is activated, and precharge the activated word line WL when the precharge command PCG is activated. In order to select a word line to be refreshed during the normal refresh operation, a refresh counter (not shown) for generating a counting address that is sequentially increasing according to the normal refresh command REF may be additionally provided. The row control circuit 212 may perform the normal refresh operation of sequentially refreshing a plurality of word lines WL corresponding to the counting address according to the normal refresh command REF.

The row control circuit 212 may perform the target refresh operation of refreshing one or more neighboring word lines of the word line WL corresponding to the target address TADD according to the target refresh command TREF. Depending on an embodiment, the row control circuit 212 may perform the target refresh operation of refreshing one or more neighboring word lines of the word line WL corresponding to the target address TADD, according to the first to eighth target refresh bank signals TREF_BK0 to TREF_BK7 provided from the refresh decoder 237, instead of the target refresh command TREF. Further, the row control circuit 212 may perform the hidden refresh operation of refreshing one or more neighboring word lines of the word line WL corresponding to the target address TADD according to the first to eighth hidden refresh bank signals SR_BK0 to SR_BK7. To sum up, the row control circuit 212 may select at least one of the first to eighth banks BK0 to BK7 according to the first to eighth target refresh bank signals TREF_BK0 to TREF_BK7 (or the target refresh command TREF), or the first to eighth hidden refresh bank signals SR_BK0 to SR_BK7, and refresh one or more neighboring word lines of the word line WL corresponding to the target address TADD.

In order to reduce the power consumption, the memory devices 200 do not perform the normal refresh operation each time the normal refresh command REF is entered, but secure intervals to skip the normal refresh operation even if the normal refresh command REF is entered. In accordance with an embodiment of the present invention, the memory devices 200 may select one of the first to eighth banks BK0 to BK7 according to the first to eighth hidden refresh bank signals SR_BK0 to SR_BK7, and perform the hidden refresh operation of refreshing one or more neighboring word lines of the word line WL corresponding to the target address TADD, during the normal refresh period.

Hereinafter, a (detailed structure of the refresh control circuit 230 will be described with reference to FIGS. 4 to 10.

Figure 4:
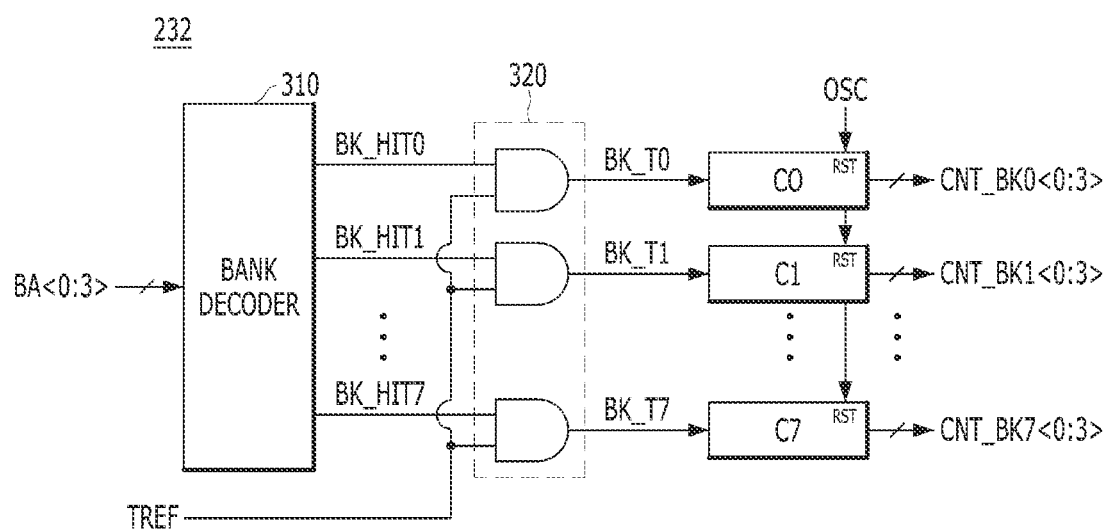
FIG. 4 is a detailed circuit diagram illustrating a refresh counting circuit shown in FIG. 3 in accordance with an embodiment of the present invention.

FIG. 4 is a detailed circuit diagram illustrating the refresh counting circuit 232 shown in FIG. 3 in accordance with an embodiment of the present invention.

Referring to FIG. 4, the refresh counting circuit 232 may include a bank decoder 310, a refresh combiner 320, and first to eighth sub-counters C0 to C7.

The bank decoder 310 may generate first to eighth bank assign signals BK_HIT0 to BK_HIT7 for respectively designating the first to eighth banks BK0 to BK7, by decoding the bank address BA<0:3>. For example, the bank decoder 310 may activate the second bank assign signal BK_HIT1 when the bank address BA<0:3> for designating the second bank BK1 is entered.

The refresh combiner 320 may output the first to eighth bank assign signals BK_HIT0 to BK_HIT7 as first to eighth bank signals BK_T0 to BK_T7, according to the target refresh command TREF. The refresh combiner 320 may be implemented with a plurality of AND gates for performing a logic AND operation on the target refresh command TREF and the first to eighth bank assign signals BK_HIT0 to BK_HIT7, respectively.

The first to eighth sub-counters C0 to C7 may respectively correspond to the first to eighth banks BK0 to BK7. Each of the first to eighth sub-counters C0 to C7 may increase its count value by +1 when a corresponding one of the first to eighth bank signals BK_T0 to BK_T7 is enabled, thereby outputting the first to eighth bank counting signals CNT_BK0 to CNT_BK7. The first to eighth sub-counters C0 to C7 may be initialized in response to the oscillating signal OSC. For example, when each of the first to eighth sub-counters C0 to C7 is composed of a 4-bit counter, the first to eighth sub-counters C0 to C7 may output the first to eighth bank counting signals CNT_BK0 to CNT_BK7 each having a count value from 0 to 15.

With the above configuration, the refresh counting circuit 232 may be initialized according to an oscillating signal OSC, and generate first to eighth bank counting signals CNT_BK0 to CNT_BK7 respectively corresponding to the first to eighth banks BK0 to BK7, by counting the number of inputs of the target refresh command TREF per bank based on the bank address BA<0:3>.

FIG. 5 is a table for describing an operation of the grade analyzing circuit 2342 shown in FIG. 3 in accordance with an embodiment of the present invention.

Referring to FIG. 5, the grade analyzing circuit 2342 may output the first to eighth bank grade signals GRADE_BK#<0:2> (where 0≤#≤7), i.e., from GRADE_BK0<0:2> to GRADE_BK7<0:2>, by mapping each of the 16 bank counting signals CNT_BK#<0:3> to one of 8 grades respectively represented by the 8 bank grade signals GRADE_BK#<0:2>. According to an embodiment, the row hammer risk per bank may be represented by the bank grade signals GRADE_BK#<0:2> corresponding to the bank. At this time, each of the first to eighth bank grade signals GRADE_BK0<0:2> to GRADE_BK7<0:2> may be composed of 3 bits, for designating the first to eighth banks BK0 to BK7 as one of the first to eighth grades.

For example, when the first bank counting signal CNT_BK0<0:3> is "0000" (CASE 1) or "0001" (CASE 2), the grade analyzing circuit 2342 may output the first bank grade signal GRADE_BK0<0:2> of "000" as a result of analysis on the row hammer risk of the first bank BK0. When the first bank counting signal CNT_BK0<0:3> is "0010" (CASE 3) or "0011" (CASE 4), the grade analyzing circuit 2342 may output the first bank grade signal GRADE_BK0<0:2> of "001" as a result of analysis on the row hammer risk of the first bank BK0. In this way, when the first bank counting signal CNT_BK0<0:3> is "1110" (CASE 15) or "1111" (CASE 16), the grade analyzing circuit 2342 may output the first bank grade signal GRADE_BK0<0:2> of "111" as a result of analysis on the row hammer risk of the first bank BK0.

Figure 6:
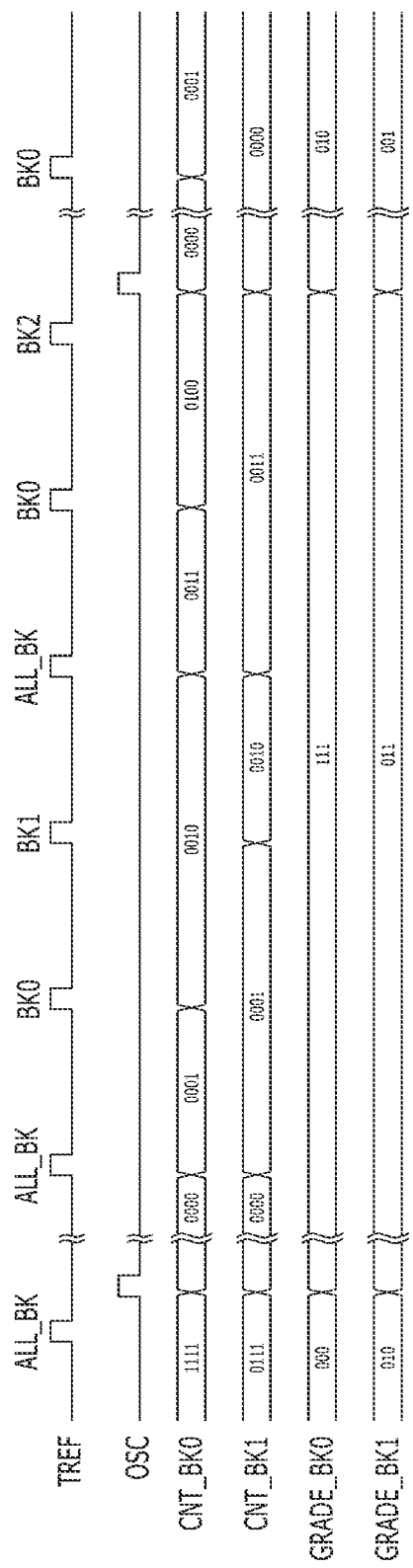
FIG. 6 is an operation waveform diagram illustrating operations of the refresh counting circuit and the grade analyzing circuit shown in FIG. 3 in accordance with an embodiment of the present invention.

As described above, as the count value of each of the first to eighth bank counting signals CNT_BK0 to CNT_BK7 increases, the grade analyzing circuit 2342 may analyze a corresponding bank as a bank vulnerable to the row hammer risk, and thus output the first to eighth bank grade signals GRADE_BK0 to GRADE_BK7 by assigning the corresponding bank to a higher grade, FIG. 6 is an operation waveform diagram illustrating operations of the refresh counting circuit 232 and the grade analyzing circuit 2342 shown in FIG. 3 in accordance with an embodiment of the present invention. FIG. 6 shows operations relating to the first and second banks BK0 and BK1.

Referring to FIG. 6, when the oscillating signal OSC is enabled, the grade analyzing circuit 2342 may latch the first and second bank counting signals CNT_BK0 and CNT_BK1. The grade analyzing circuit 2342 may output the first and second bank grade signals GRADE_BK0 and GRADE_BK1 by dividing the row hammer risk of each of the first and second banks BK0 and BK1 into one of the first to eighth grades according to the latched bank counting signals CNT_BK0 and CNT_BK1. For example, as described in FIG. 5, when the latched first bank counting signal CNT_BK0 is "1111" (CASE 16), the grade analyzing circuit 2342 outputs the first bank grade signal GRADE_BK0 of "111" by determining the first bank BK0 as the eighth grade. When the latched second bank counting signal CNT_BK1 is "0111" (CASE 8), the grade analyzing circuit 2342 outputs the second bank grade signal GRADE_BK1 of "011" by determining the second bank BK1 as the fourth grade.

Further, when the oscillating signal OSC is enabled, the refresh counting circuit 232 may be initialized according to an oscillating signal OSC, and generate the first and second bank counting signals CNT_BK0 and CNT_BK1 by counting the number of inputs of the target refresh command TREF per bank based on the bank address BA<0:3>. For example, when the bank address BA<0:3> for designating the first bank BK0 is inputted, the refresh counting circuit 232 increases the count value of the first bank counting signal CNT_BK0 by +1 according to the target refresh command TREF. For reference, when the bank address BA<0:3> for designating all banks is inputted, the refresh counting circuit 232 increases the count values of all of the first to eighth bank counting signals CNT_BK0 to CNT_BK7 by +1 according to the target refresh command TREF.

Figure 7:
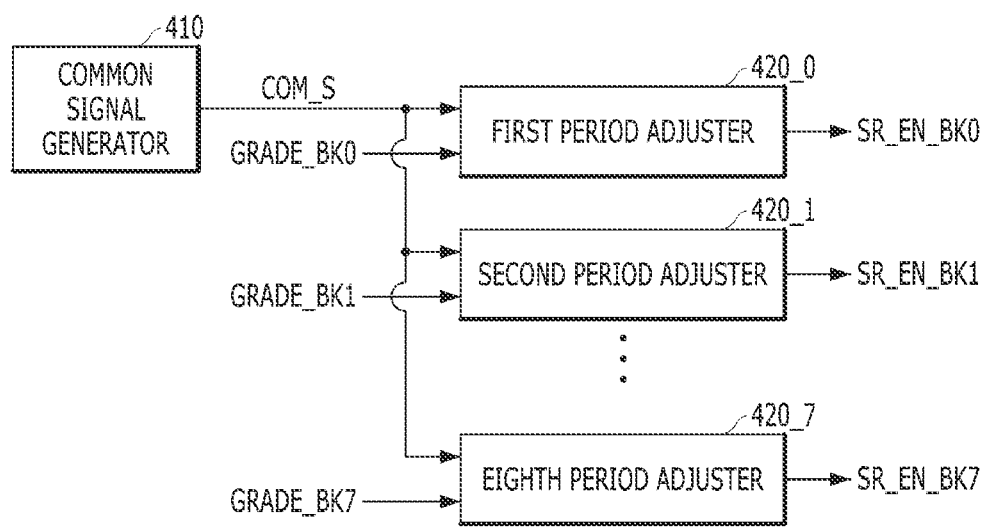
FIG. 7 is a detailed block diagram illustrating a period control circuit shown in FIG. 3 in accordance with an embodiment of the present invention.

FIG. 7 is a detailed block diagram illustrating the period control circuit 2344 shown in FIG. 3 in accordance with an embodiment of the present invention.

Referring to FIG. 7, the period control circuit 2344 may include a common signal generator 410 and first to eighth period adjusters 420_0 to 420_7.

The common signal generator 410 may generate at least one common signal COM_S having a certain period. Depending on an embodiment, the common signal generator 410 may generate the common signal COM_S based on the oscillating signal OSC.

The first to eighth period adjusters 420_0 to 420_7 may respectively correspond to the first to eighth banks BK0 to BK7. The first to eighth period adjusters 420_0 to 420_7 may output the first to eighth period control signals SR_EN_BK0 to SR_EN_BK7 by defining the activation sections of the first to eighth period control signals SR_EN_BK0 to SR_EN_BK7, respectively. Each of the first to eighth period adjusters 420_0 to 420_7 may define the activation section of a corresponding period control signal of the first to eighth period control signals SR_EN_BK0 to SR_EN_BK7 by adjusting the activation section of the common signal COM_S according to a corresponding bank grade signal of the first to eighth bank grade signals GRADE_BK0 to GRADE_BK7. Each of the first to eighth period adjusters 420_0 to 420_7 may adjust the activation section of the common signal COM_S to be longer than a reference section as a value of a corresponding bank grade signal of the first to eighth bank grade signals GRADE_BK0 to GRADE_BK7 increases, i.e., the corresponding grade is higher. For example, when the first bank grade signal GRADE_BK0 is "000", the first period adjuster 420_0 may adjust the activation section of the common signal COM_S identical to the reference section. When the first bank grade signal GRADE_BK0 is "111", the first period adjuster 420_0 may adjust the activation section of the common signal COM_S longer than the reference section to be maximized.

With the above configuration, the period control circuit 2344 may generate the first to eighth period control signals SR_EN_BK0 to SR_EN_BK7 whose activations sections are adjusted by the first to eighth bank grade signals GRADE_BK0 to GRADE_BK7.

Figure 8:
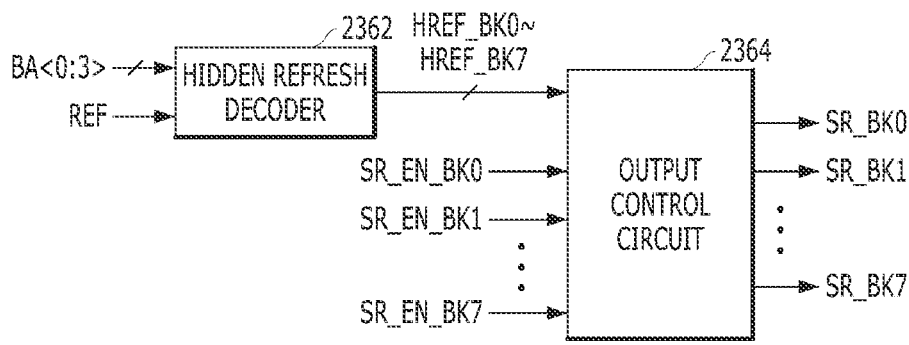
FIG. 8 is a detailed block diagram illustrating a bank control circuit shown in FIG. 3 in accordance with an embodiment of the present invention.
Figure 9:
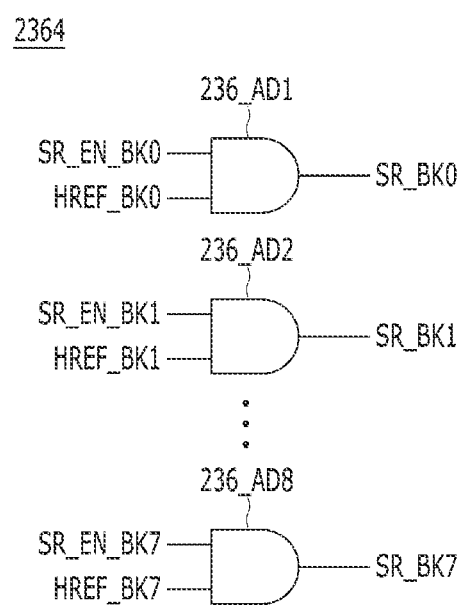
FIG. 9 is a detailed circuit diagram illustrating an output control circuit shown in FIG. 8 in accordance with an embodiment of the present invention.

FIG. 8 is a detailed block diagram illustrating the bank control circuit 236 shown in FIG. 3 in accordance with an embodiment of the present invention. FIG. 9 is a detailed circuit diagram illustrating an output control circuit 2364 shown in FIG. 8 in accordance with an embodiment of the present invention.

Referring to FIG. 8, the bank control circuit 236 may include a hidden refresh decoder 2362 and an output control circuit 2364.

The hidden refresh decoder 2362 may generate first to eighth hidden refresh signals HREF_BK0 to HREF_BK7 respectively corresponding to the first to eighth banks BK0 to BK7, by decoding the bank address BA<0:3> according to the normal refresh command REF. For example, the hidden refresh decoder 2362 may activate the second hidden refresh signal HREF_BK1 corresponding to the second bank BK1 when the bank address BA<0:3> for designating the second bank BK1 is inputted.

The output control circuit 2364 may generate the first to eighth hidden refresh bank signals SR_BK0 to SR_BK7 according to the first to eighth hidden refresh signals HREF_BK0 to HREF_BK7 and the first to eighth period control signals SR_EN_BK0 to SR_EN_BK7. The output control circuit 2364 may activate a corresponding hidden refresh bank signal when both of a corresponding hidden refresh signal and a corresponding period control signal are enabled. Referring to FIG. 9, the output control circuit 2364 may include first to eighth AND gates 236_AD1 to 236_AD8 for performing a logic AND operation on the first to eighth hidden refresh signals HREF_BK0 to HREF_BK7 and the first to eighth period control signals SR_EN_BK0 to SR_EN_BK7, respectively.

With the above configuration, the bank control circuit 236 may output the first to eighth hidden refresh bank signals SR_BK0 to SR_BK7 according to the bank address BA<0:3> and the first to eighth period control signals SR_EN_BK0 to SR_EN_BK7, when the normal refresh command REF is inputted.

Figure 10:
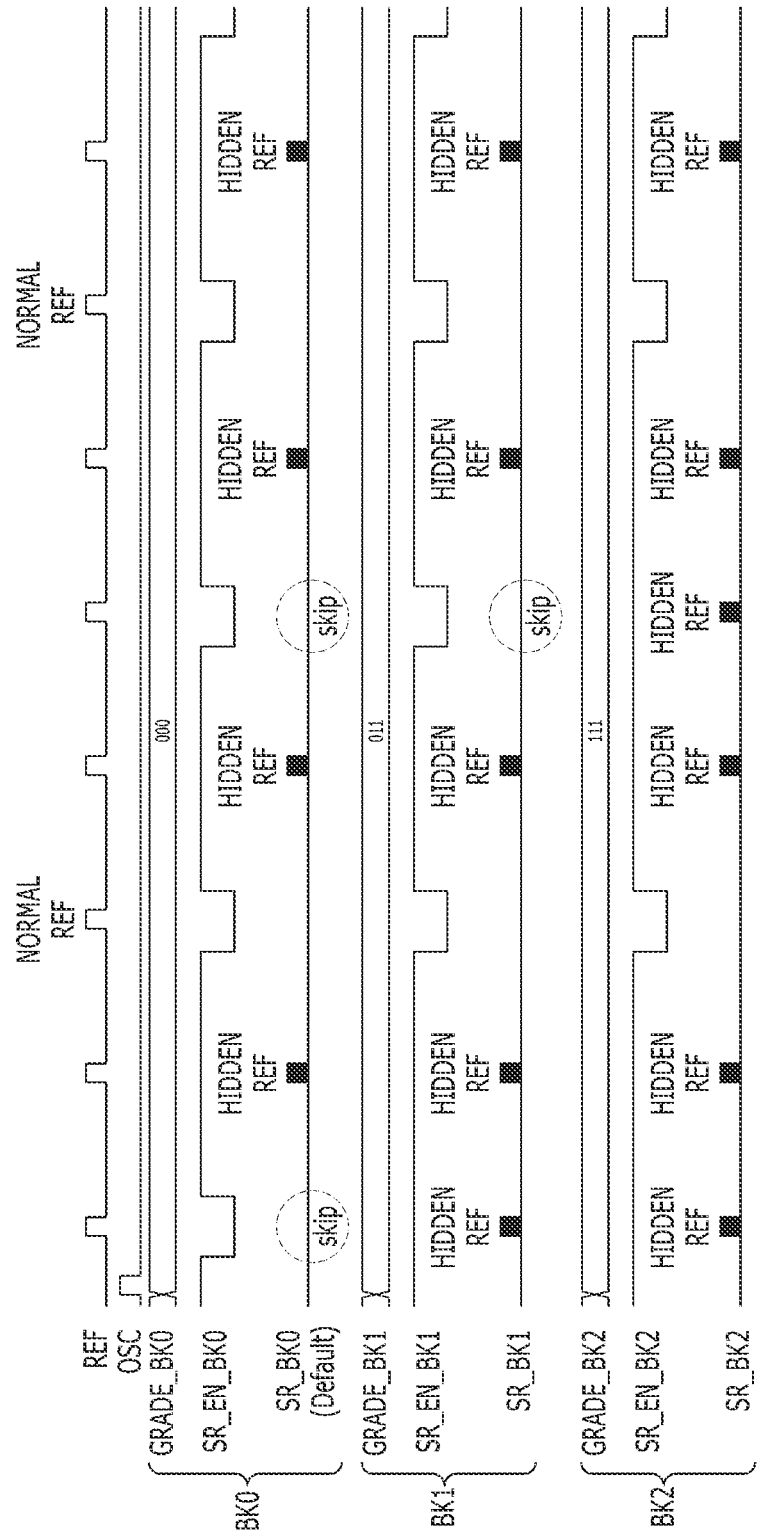
FIG. 10 is a timing diagram for describing a method of adjusting a target refresh period of each bank in accordance with an embodiment of the present invention.

FIG. 10 is a timing diagram for describing a method of adjusting a target refresh period of each bank in accordance with an embodiment of the present invention. FIG. 10 shows operations relating to the first to third banks BK0 to BK2. In FIG. 10, an example is illustrated in which a normal refresh operation as performed in response to every four inputs of the normal refresh command REF for power savings.

Referring to FIG. 10, when the oscillating signal OSC is enabled, the grade analyzing circuit 2342 may output the first to third bank grade signals GRADE_BK0 to GRADE_BK2 by determining the row hammer risk of each of the first to third banks BK0 to BK2 as one of the grades according to the first to third bank counting signals CNT_BK0 to CNT_BK2. For example, the grade analyzing circuit 2342 may analyze the first bank BK0 as the first grade to generate the first bank grade signal GRADE_BK0 of "000", analyze the second bank BK1 as the fourth grade to generate the second bank grade signal GRADE_BK1 of "011", and analyze the third bank BK2 as the eighth grade to generate the third bank grade signal GRADE_BK2 of "111".

The period control circuit 2344 may generate the first period control signal SR_EN_BK0 whose activation section is set to a default value (i.e., the reference section), according to the first bank grade signal GRADE_BK0 of "000". The period control circuit 2344 may generate the second period control signal SR_EN_BK1 whose activation section is longer than that of the first period control signal SR_EN_BK0, according to the second bank grade signal GRADE_BK1 of "011". The period control circuit 2344 may generate the third period control signal SR_EN_BK2 whose activation section is longer than that of the second period control signal SR_EN_BK1, according to the third bank grade signal GRADE_BK2 of "111". That is, the period control circuit 2344 may adjust the activation section of the third period control signal SR_EN_BK2 to be the longest while adjusting the activation section of the first period control signal SR_EN_BK0 to be the shortest. As a result, the period control circuit 2344 may generate the first to third period control signals SR_EN_BK0 to SR_EN_BK2 such that the greater the values of the first to third bank grade signals GRADE_BK0 to GRADE_BK2, the longer the activation sections of the first to third period control signals SR_EN_BK0 to SR_EN_BK2.

The bank control circuit 236 may output the first to third hidden refresh bank signals SR_BK0 to SR_BK2 according to the first to third period control signals SR_EN_BK0 to SR_EN_BK2, when the normal refresh command REF is inputted. Thus, the bank control circuit 236 may output the first to third hidden refresh bank signals SR_BK0 to SR_BK2 to perform the hidden refresh operation during the normal refresh period, while controlling the activation of the first to third hidden refresh bank signals SR_BK0 to SR_BK2 according to the first to third period control signals SR_EN_BK0 to SR_EN_BK2, As a result, the target refresh period (rate) of the third bank BK2 vulnerable to the row hammer risk becomes shorter, and the target refresh period (rate) of the first bank BK0 resistant to the row hammer risk becomes longer.

As described above, the memory device 200 in accordance with an embodiment may determine the row hammer risk level per bank by counting, within the periodic interval, the number of inputs of the target refresh command TREF per bank. The memory device 200 may perform the hidden refresh operation according to the determined row hammer risk level per bank and the normal refresh command REF. That is, by additionally performing the hidden refresh operation for preventing the row hammering phenomenon, during the normal refresh period, it is possible to adjust the target refresh period per bank, thereby improving the target refresh efficiency.

Figure 11:
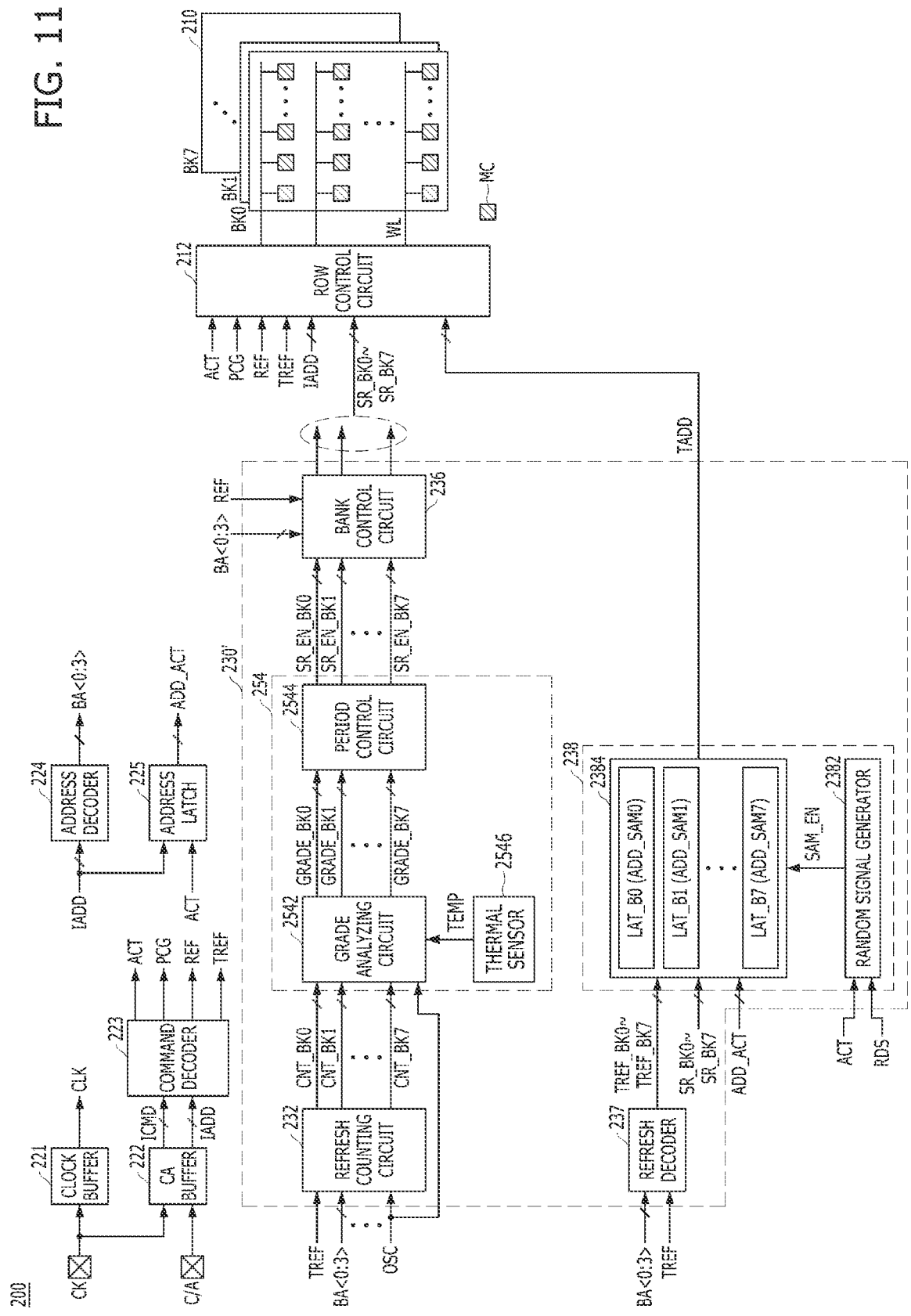
FIG. 11 is a detailed block diagram illustrating a memory device shown in FIG. 1, in accordance with an embodiment of the present invention.

FIG. 11 is a detailed block diagram illustrating the memory device 200 shown in FIG. 1, in accordance with an embodiment of the present invention. FIG. 12 is a table for describing an operation of a grade analyzing circuit 2542 shown in FIG. 11 in accordance with an embodiment of the present invention.

Referring to FIG. 11, the memory device 200 may include the memory cell array 210, a row control circuit 212, a clock buffer 221, a command/address (CA) buffer 222, a command decoder 223, an address decoder 224, an address latch 225, and the refresh control circuit 230'.

The memory cell array 210, the row control circuit 212, the dock buffer 221, the CA buffer 222, the command decoder 223, the address decoder 224, and the address latch 225 of FIG. 11 may have configurations substantially the same as those of FIG. 3.

The refresh control circuit 230' may determine a row hammer risk level per bank by counting, within a periodic interval, the number of inputs of a target refresh command TREF per bank based on a bank address BA<0:3>. The refresh control circuit 230' may perform a hidden refresh operation according to the determined row hammer risk level per bank and thermal information TEMP when a normal refresh command REF is inputted. The refresh control circuit 230' may control an activation of first to eighth hidden refresh bank signals SR_BK0 to SR_BK7 in response to the normal refresh command REF such that each of first to eighth banks BK0 to BK7 has a target refresh period (frequency or rate) corresponding to the determined row hammer risk level and the thermal information TEMP. Further, the refresh control circuit 230' may store a plurality of sample addresses ADD_SAM0 to ADD_SAMn by sampling an active address ADD_ACT according to an active command ACT at random times, and provide as a target address TADD at least one selected from the sample addresses ADD_SAM0 to ADD_SAMn according to the target refresh command TREF or the first to eighth hidden refresh bank signals SR_BK0 to SR_BK7.

In detail, the refresh control circuit 230' may include a refresh counting circuit 232, a risk analysis circuit 254, a bank control circuit 236, a refresh decoder 237, and an address storing circuit 238. The is refresh counting circuit 232, the bank control circuit 236, the refresh decoder 237 and the address storing circuit 238 of FIG. 11 may have configurations substantially the same as those of FIG. 3.

The risk analysis circuit 254 may analyze a row hammer risk each of the first to eighth banks BK0 to BK7 according to first to eighth bank counting signals CNT_BK0 to CNT_BK7, and generate first to eighth period control signals SR_EN_BK0 to SR_EN_BK7, each having an activation section determined depending on a result of the analysis and the thermal information TEMP. The risk analysis circuit 254 may operate in synchronization with an oscillating signal OSC. For example, as a value of a bank counting signal increases or a temperature indicated by the thermal information TEMP decreases, the risk analysis circuit 254 may analyze a corresponding bank as a bank vulnerable to the row hammer risk, and adjust the activation section of the corresponding period control signal to increase in comparison with a reference section. On the contrary, as a value of a bank counting signal decreases or a temperature indicated by the thermal information TEMP increases, the risk analysis circuit 254 may analyze a corresponding bank as a bank resistant to the row hammer risk, and adjust the activation section of the corresponding period control signal to decrease in comparison with the reference section.

In detail, the risk analysis circuit 254 may include a grade analyzing circuit 2542, a period control circuit 2544, and a thermal sensor 2546. The period control circuit 2544 of FIG. 11 may have a configuration substantially the same as that of FIG. 3.

The thermal sensor 2546 may generate the thermal information TEMP by measuring an operational temperature of the memory device 200. The memory device 200 may include one or more registers (e.g., a mode register) to store the thermal information TEMP measured by the thermal sensor 2546.

The grade analyzing circuit 2542 may latch the first to eighth bank counting signals CNT_BK0 to CNT_BK7 according to the oscillating signal OSC, and output first to eighth bank grade signals GRADE_BK0 to GRADE_BK7 by dividing the row hammer risk of each of the first to eighth banks BK0 to BK7 into one of a plurality of grades according to the latched bank counting signals CNT_BK0 to CNT_BK7 and the thermal information TEMP provided from the thermal sensor 2545.

Referring to FIG. 12, the grade analyzing circuit 2542 may output first to eighth preliminary bank grade signals PRE_GRADE_BK0<0:2> to PRE_GRADE_BK7<0:2> each composed of 3 bits, by determining the row hammer risk of each of the first to eighth banks BK0 to BK7 as one of first to eighth grades according to the first to eighth bank counting signals CNT_BK0<0:3> to CNT_BK7<0:3> each composed of 4 bits. Further, the grade analyzing circuit 2542 may redefine the first to eighth preliminary bank grade signals PRE_GRADE_BK0<0:2> to PRE_GRADE_BK7<0:2> to output the first to eighth bank grade signals GRADE_BK0<0:2> to GRADE_BK7<0:2>, according to the thermal information TEMP.

The grade analyzing circuit 2542 may output the first to eighth preliminary bank grade signals PRE_GRADE_BK0<0:2> to PRE_GRADE_BK7<0:2>, as the first to eighth bank grade signals GRADE_BK0<0:2> to GRADE_BK7<0:2>, when the temperature indicated by the thermal information TEMP is higher than a reference temperature (e.g., a room temperature). On the contrary, the grade analyzing circuit 2542 may output the first to eighth bank grade signals GRADE_BK0<0:2> to GRADE_BK7<0:2> by increasing values of the first to eighth preliminary bank grade signals PRE_GRADE_BK0<0:2> by +1, when the temperature indicated by the thermal information TEMP is lower than or equal to the reference temperature. For example, when the temperature indicated by the thermal information TEMP is lower than the reference temperature, the grade analyzing circuit 2542 may output the bank grade signal GRADE_BK0<0:2> of "001" even if the first preliminary bank grade signals PRE_GRADE_BK0<0:2> is "000".

Referring back to FIG. 11, the period control circuit 2544 may generate the first to eighth period control signals SR_EN_BK0 to SR_EN_BK7, each having the activation section determined depending on the first to eighth bank grade signals GRADE_BK0 to GRADE_BK7.

As described above, the memory device 200 in accordance with an embodiment may determine the row hammer risk level per bank by counting, within the periodic interval, the number of inputs of the target refresh command TREF per bank. The memory device 200 may perform the hidden refresh operation in consideration of both of the determined row hammer risk level per bank and the thermal information TEMP. In general, the lower the operating temperature of the memory device, the greater the row hammer risk, so it needs to be adjusted so that the lower the temperature, the higher the target refresh period (i.e., the refresh rate). When the temperature information is received from the memory controller outside the memory device, it takes time to send and receive command and data to receive the temperature information, making it difficult to receive current accurate temperature information. In accordance with an embodiment of this invention, both power consumption and performance improvement may be achieved by obtaining the temperature information directly within the memory device to control the target refresh period.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory system, comprising:
a memory controller suitable for:
generating a normal refresh command and a target refresh command when a number of inputs of an active command reaches a certain number, and
providing the active command, the normal refresh command, the target refresh command, and an address; and
a memory device including a plurality of banks and suitable for:
performing a target refresh operation on one or more word lines of at least one bank in response to the target refresh command,
determining a row hammer risk level per bank by counting, within a periodic interval, a number of inputs of the target refresh command per bank based on the address, and
performing a hidden refresh operation corresponding to the row hammer risk level per bank in response to the normal refresh command.

2. The memory system of claim 1, wherein the memory controller includes:
a command counter suitable for generating a count value by counting the number of inputs of the active command; and
a counter analyzer suitable for issuing the target refresh command after issuing a set number of the normal refresh commands at regular intervals when the count value reaches a certain value.

3. The memory system of claim 1, wherein the memory device includes:
a refresh counting circuit initialized according to an oscillating signal, and suitable for generating a plurality of bank counting signals by counting the number of inputs of the target refresh command per bank based on a bank address included in the address;
a risk analysis circuit suitable for analyzing a row hammer risk per bank according to the bank counting signals, and generating a plurality of period control signals each having an activation section determined depending on a result of the analyzing;
a bank control circuit suitable for outputting, when the normal refresh command is inputted, a plurality of hidden refresh bank signals according to the bank address and the period control signals;
a refresh decoder suitable for generating a plurality of target refresh bank signals by decoding the bank address according to the target refresh command; and
a row control circuit suitable for selecting at least one of the banks according to the hidden refresh bank signals or the target refresh bank signals and refreshing one or more word lines of the selected bank according to a target address.

4. The memory system of claim 3, wherein the memory device further includes:
an address latch suitable for latching, in response to the active command, the address to provide an active address; and
an address storing circuit suitable for generating a plurality of sample addresses by latching the active address at random times and outputting, as the target address, at least one selected from the sample addresses according to the target refresh bank signals or the hidden refresh bank signals.

5. The memory system of claim 3, wherein the refresh counting circuit includes:
a bank decoder suitable for generating a plurality of bank assign signals by decoding the bank address;
a refresh combiner suitable for outputting the bank assign signals as a plurality of bank signals according to the target refresh command; and
a plurality of sub-counters respectively corresponding to the banks, initialized by the oscillating signal, and each suitable for outputting a corresponding bank counting signal of the bank counting signals by increasing a corresponding count value when a corresponding one of the bank signals is enabled.

6. The memory system of claim 3, wherein the risk analysis circuit includes:
a grade analyzing circuit suitable for latching the bank counting signals according to the oscillating signal and outputting a plurality of bank grade signals by mapping, based on the analyzing of the row hammer risk per bank, each of the latched bank counting signals to one of a plurality of grades respectively represented by the bank grade signals; and
a period control circuit suitable for generating the period control signals each having the activation section determined depending on the bank grade signals.

7. The memory system of claim 6, wherein the period control circuit includes:
   a common signal generator suitable for generating at least one common signal; and
   a plurality of period adjusters suitable for:
      defining the activation sections of the respective period control signals by adjusting an activation section of the common signal according to a corresponding bank grade signal of the bank grade signals, and
      outputting the period control signals corresponding to the banks and having the defined activation sections, respectively.

8. The memory system of claim 6, wherein the period control circuit generates the period control signals by:
   adjusting the respective activation sections of the period control signals to be longer than a reference section as respective values of the bank grade signals increase, and
   adjusting the respective activation sections of the period control signals to be shorter than the reference section as the respective values of the bank grade signals decrease.

9. The memory system of claim 3,
   wherein the memory device further includes a thermal sensor suitable for generating thermal information by measuring an operational temperature of the memory device, and
   wherein the risk analysis circuit is suitable for generating the period control signals according to the bank counting signals and the thermal information.

10. The memory system of claim 3, wherein the bank control circuit includes:
   a hidden refresh decoder suitable for generating a plurality of hidden refresh signals by decoding the bank address according to the normal refresh command; and
   an output control circuit suitable for generating the hidden refresh bank signals according to the hidden refresh signals and the period control signals.

11. A semiconductor memory device, comprising:
   a plurality of banks;
   a refresh control circuit suitable for:
      determining a row hammer risk level per bank by counting, within a periodic interval, a number of inputs of a target refresh command per bank based on a bank address,
      generating a plurality of hidden refresh bank signals corresponding to the row hammer risk level per bank in response to a normal refresh command,
      storing a plurality of sample addresses by sampling an active address in response to an active command, and
      providing, as a target address, at least one selected from the sample addresses in response to the target refresh command or the hidden refresh bank signals; and
   a row control circuit suitable for:
      selecting at least one of the banks in response to the target refresh command or the hidden refresh bank signals, and
      refreshing one or more word lines of the selected bank according to the target address.

12. The semiconductor memory device of claim 11, further comprising: an address latch suitable for latching, in response to the active command, an address to provide the active address.

13. The semiconductor memory device of claim 11, wherein the refresh control circuit includes:
   a refresh counting circuit initialized according to an oscillating signal, and suitable for generating a plurality of bank counting signals by counting the number of inputs of the target refresh command per bank based on the bank address;
   a risk analysis circuit suitable for generating, based on the determining of the row hammer risk level per bank, a plurality of period control signals each having an activation section determined depending on the bank counting signals;
   a bank control circuit suitable for generating, when the normal refresh command is inputted, the plurality of hidden refresh bank signals according to the bank address and the period control signals; and
   an address storing circuit suitable for generating the sample addresses by latching the active address at random times and outputting, as the target address, at least one selected from the sample addresses according to the target refresh command or the hidden refresh bank signals.

14. The semiconductor memory device of claim 13, wherein the refresh counting circuit includes:
   a bank decoder suitable for generating a plurality of bank assign signals by decoding the bank address;
   a refresh combiner suitable for outputting the bank assign signals as a plurality of bank signals according to the target refresh command; and
   a plurality of sub-counters respectively corresponding to the banks, initialized by the oscillating signal, and each suitable for outputting a corresponding bank counting signal of the bank counting signals by increasing a corresponding count value when a corresponding bank signal of the bank signals is enabled.

15. The semiconductor memory device of claim 13, wherein the risk analysis circuit includes:
   a grade analyzing circuit suitable for latching the bank counting signals according to the oscillating signal, and outputting a plurality of bank grade signals by mapping each of the latched bank counting signals to one of a plurality of grades respectively represented by the bank grade signals; and
   a period control circuit suitable for generating the period control signals each having the activation section determined depending on the bank grade signals.

16. The semiconductor memory device of claim 15, wherein the period control circuit includes:
   a common signal generator suitable for generating at least one common signal; and
   a plurality of period adjusters suitable for:
      defining the activation sections of the respective period control signals by adjusting an activation section of the common signal according to a corresponding bank grade signal of the bank grade signals, and
      outputting the period control signals corresponding to the banks and having the defined activation sections, respectively.

17. The semiconductor memory device of claim 15, wherein the period control circuit generates the period control signals by:
   adjusting the respective activation sections of the period control signals to be longer than a reference section as respective values of the bank grade signals increase, and
      adjusting the respective activation sections of the period control signals to be shorter than the reference section as the respective values of the bank grade signals decrease.

18. The semiconductor memory device of claim 13, wherein the risk analysis circuit includes:
- a thermal sensor suitable for generating thermal information by measuring an operational temperature of the semiconductor memory device;
- a grade analyzing circuit suitable for latching the bank counting signals according to the oscillating signal, and outputting a plurality of bank grade signals by mapping, based on at least the thermal information, each of the latched bank counting signals to one of a plurality of grades respectively represented by the bank grade signals; and
- a period control circuit suitable for generating the period control signals each having the activation section determined depending on the bank grade signals.

19. The semiconductor memory device of claim 13, wherein the bank control circuit includes:
- a hidden refresh decoder suitable for generating a plurality of hidden refresh signals by decoding the bank address according to the normal refresh command; and
- an output control circuit suitable for generating the hidden refresh bank signals according to the hidden refresh signals and the period control signals.

20. The semiconductor memory device of claim 13, wherein the address storing circuit includes:
- a random signal generator suitable for generating a sampling signal according to a random signal and the active command; and
- a latch circuit suitable for storing the active address as the sample addresses according to the sampling signal and outputting, as the target address, the selected sample address according to the target refresh command or the hidden refresh bank signals.

21. An operating method of a memory device, the operating method comprising:
- repeating a normal refresh operation on a bank, the normal refresh operation being performed in response to plural normal refresh commands; and
- repeating a hidden refresh operation on the bank according to each target address by:
  - defining a periodic activation section based on a number of times that a target refresh operation is repeated on the bank within a periodic interval;
  - generating, during the periodic activation section, a periodic hidden refresh signal in response to each of the normal refresh commands; and
  - selecting the target address from active addresses in response to the periodic hidden refresh signal.

22. The operating method of claim 21, wherein the defining the periodic activation section includes:
- increasing the periodic activation section as the number becomes greater; and
- decreasing the periodic activation section as the number becomes smaller.

* * * * *